US011822250B2

(12) United States Patent
Iida et al.

(10) Patent No.: US 11,822,250 B2
(45) Date of Patent: Nov. 21, 2023

(54) SOLUTION, METHOD OF FORMING RESIST PATTERN, AND SEMICONDUCTOR DEVICE MANUFACTURING METHOD

(71) Applicant: TOKYO OHKA KOGYO CO., LTD., Kawasaki (JP)

(72) Inventors: Hiroyuki Iida, Kawasaki (JP); Motoki Takahashi, Kawasaki (JP); Masaharu Nakamura, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 386 days.

(21) Appl. No.: 16/806,838

(22) Filed: Mar. 2, 2020

(65) Prior Publication Data

US 2020/0301283 A1 Sep. 24, 2020

(30) Foreign Application Priority Data

Mar. 22, 2019 (JP) ................................ 2019-054948

(51) Int. Cl.

| | |
|---|---|
| ***G03F 7/32*** | (2006.01) |
| ***G03F 7/42*** | (2006.01) |
| ***G03F 7/30*** | (2006.01) |
| ***H01L 21/02*** | (2006.01) |
| ***G03F 7/40*** | (2006.01) |
| ***H01L 21/027*** | (2006.01) |
| ***G03F 7/16*** | (2006.01) |
| ***C11D 7/26*** | (2006.01) |
| ***C11D 7/50*** | (2006.01) |
| ***G03F 7/004*** | (2006.01) |

(52) U.S. Cl.

CPC .............. *G03F 7/325* (2013.01); *C11D 7/267* (2013.01); *C11D 7/5004* (2013.01); *G03F 7/0048* (2013.01); *G03F 7/16* (2013.01); *G03F 7/30* (2013.01); *G03F 7/3028* (2013.01); *G03F 7/32* (2013.01); *G03F 7/40* (2013.01); *G03F 7/422* (2013.01); *G03F 7/425* (2013.01); *H01L 21/0206* (2013.01); *H01L 21/02041* (2013.01); *H01L 21/0273* (2013.01)

(58) Field of Classification Search

None

See application file for complete search history.

(56) References Cited

U.S. PATENT DOCUMENTS

| | | | | |
|---|---|---|---|---|
| 2015/0044613 A1 | | 2/2015 | Irie et al. | |
| 2018/0193320 A1 | * | 7/2018 | Kaupinen | A61K 47/38 |

FOREIGN PATENT DOCUMENTS

| | | | | | |
|---|---|---|---|---|---|
| JP | 09-049000 A | | 2/1997 | |
| JP | 2002-258475 A | | 9/2002 | |
| JP | 2015-034926 A | | 2/2015 | |
| JP | 2015132804 | * | 7/2015 | A61L 27/00 |
| TW | 201520694 A | | 6/2015 | |
| WO | WO 2018/043690 A1 | | 3/2018 | |

OTHER PUBLICATIONS

H.J. Lips, Stability of d-a-Tocopherol Alone, in Solvents, and in Methyl Esters of Fatty Acids, The Journal of the American Oil Chemist's Society, vol. 34, pp. 513-515. (Year: 1957).*

D. Marguardt et al., "Vitamin E Circular Dichroism Studies: Insights into Conformational Changes Induced by the Solvent's Polarity", Membranes, vol. 6, paper #56, pp. 1-8 (Year: 2016).*

Office Action in Japanese Patent Application No. 2019-054948, dated Jul. 23, 2019.

* cited by examiner

*Primary Examiner* — Jiong-Ping Lu

(74) *Attorney, Agent, or Firm* — Knobbe, Martens, Olson & Bear, LLP

(57) ABSTRACT

A solution including an organic solvent (S), and an antioxidant (A), in which an antioxidant (A) includes a tocopherol compound (A1).

10 Claims, No Drawings

SOLUTION, METHOD OF FORMING RESIST PATTERN, AND SEMICONDUCTOR DEVICE MANUFACTURING METHOD

This application claims priority based on Japanese Patent Application No. 2019-054948 filed in Japan on Mar. 22, 2019, the contents of which are incorporated herein.

BACKGROUND OF THE INVENTION

Field of the Invention

The present invention relates to a solution, a method of forming a resist pattern using the solution, and a semiconductor device manufacturing method including the method of forming a resist pattern.

Description of Related Art

In lithography techniques, for example, a step is performed in which a resist pattern having a predetermined shape is formed in a resist film by forming a resist film formed of a resist composition on a substrate, performing selective exposure on the resist film, and carrying out a developing process using a developer solution. In addition, a pre-wetting process may be performed on the substrate using a pre-wetting solution before applying the resist composition to the substrate or a rinsing process may be performed using a rinsing solution after the developing process.

As lithography techniques advance and there is an increasing tendency toward finer resist patterns, there are demands for the pre-wetting solution, developer solution, rinsing solution, and solvent included in the resist composition used in the semiconductor device manufacturing method described above to be higher quality in terms of being high purity, high stability, and the like.

For example, Patent Document 1 proposes a cleaning composition including an organic solvent and an antioxidant which prevents oxidation of the organic solvent, in which the boiling point of the antioxidant is lower than the boiling point of dibutyl hydroxy toluene. According to this cleaning composition, it is possible to provide a cleaning composition which prevents oxidative deterioration and for which continuous restoration by distillation is possible.

In addition, as a measure for preventing the oxidation of organic solvents, dibutyl hydroxy toluene (also referred to below as BHT), which is a radical chain inhibitor used for plastic antioxidants, may also be added to the organic solvents.

PRIOR ART DOCUMENTS

Patent Literature

[Patent Document 1] Japanese Unexamined Patent Application, First Publication No. H9-49000

SUMMARY OF THE INVENTION

However, in a case where a semiconductor device is manufactured using the antioxidant included in the cleaning composition of Patent Document 1, defects derived from the antioxidant may be generated.

Therefore, for solutions used in a method for manufacturing a semiconductor device, there is a demand for a solution for which deterioration over time is suppressed, the stability is high, and defects are not easily generated.

The present invention was made in view of the circumstances described above and has an object of providing a solution which has high stability and which is able to suppress the generation of defects.

In order to solve the above problems, the present invention adopts the configurations described below.

That is, a first aspect of the present invention is a solution including an (S) component: an organic solvent, and an (A) component: an antioxidant, in which the (A) component includes an (A1) component: a tocopherol-based compound.

A second aspect of the present invention is a method of forming a resist pattern including a pre-wetting step of bringing a pre-wetting solution into contact with a support, a step of forming a resist film using a resist composition on the support after the pre-wetting step, a step of exposing the resist film, and a step of developing the resist film after exposure using a developer solution to form a resist pattern, in which the solution according to the first aspect of the present invention is used as the pre-wetting solution.

A third aspect of the present invention is a method of forming a resist pattern including a step of forming a resist film using a resist composition on a support, a step of exposing the resist film, and a step of developing the resist film after exposure using a developer solution to form a resist pattern, in which the resist composition includes the solution according to the first aspect of the present invention.

A fourth aspect of the present invention is a method of forming a resist pattern including a step of forming a resist film using a resist composition on a support, a step of exposing the resist film, and a step of developing the resist film after exposure using a developer solution to form a resist pattern, in which the solution according to the first aspect of the present invention is used as the developer solution.

A fifth aspect of the present invention is a method for manufacturing a semiconductor device, including a step of forming a resist pattern by the method of forming a resist pattern according to any one of the second to fourth aspects of the present invention.

According to the present invention, it is possible to provide a solution which has high stability and which is able to suppress the generation of defects.

DETAILED DESCRIPTION OF THE INVENTION (Solution)

A first aspect of the present invention is a solution including an (S) component: an organic solvent, and an (A) component: an antioxidant, in which the (A) component includes an (A1) component: a tocopherol-based compound.

<(S) Component: Organic Solvent>

The (S) component is an organic solvent.

The (S) component in the present embodiment is not particularly limited and examples thereof include various organic solvents used for manufacturing a semiconductor device, or various organic solvents used in processes for manufacturing various materials used for manufacturing a semiconductor device. Among the above, the (S) component preferably includes one type or more selected from the group consisting of ester-based solvents, ketone-based solvents, ether-based solvents, alcohol-based solvents, nitrile-based solvents, amide-based solvents, and sulfoxide-based solvents.

<Ester-Based Solvent>

The ester-based solvent is an organic solvent including (—C(═O)—O—) in the structure.

Examples of the ester-based solvent include methyl acetate, ethyl acetate, propyl acetate, isopropyl acetate, butyl acetate, amyl acetate, isoamyl acetate, ethyl methoxyacetate, ethyl ethoxyacetate, 2-methoxybutyl acetate (2-methoxybutyl acetate), 3-methoxybutyl acetate (3-methoxybutyl acetate), 4-methoxybutyl acetate (4-methoxybutyl acetate), 3-methoxy-3-methylbutyl acetate (3-methoxy-3-methylbutyl acetate), 3-ethyl acetate-3-methoxybutyl (3-ethyl-3-methoxybutyl acetate), ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monoethyl ether acetate, diethylene glycol monopropyl ether acetate, diethylene glycol monobutyl ether acetate, diethylene glycol monophenyl ether acetate, propylene glycol monomethyl ether acetate (PGMEA), propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, propyl formate, butyl formate, ethyl lactate (EL), propyl lactate, butyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, propyl-3-methoxypropionate, and the like. Among these, as the ester-based solvent, butyl acetate and ethyl lactate (EL) are preferable, and ethyl lactate (EL) is more preferable.

<Ketone-Based Solvent>

The ketone-based solvent is an organic solvent having a carbonyl group (ketone: —C(═O)—) other than an ester bond.

Examples of ketone-based solvents include acetone, 1-hexanone, 2-hexanone, 4-heptanone, 2-heptanone (methyl amyl ketone), 1-octanone, 2-octanone, 1-nonanone, 2-nonanone, diisobutyl ketone, methyl ethyl ketone, methyl isobutyl ketone, acetyl acetone, acetonyl acetone, phenyl acetone, acetophenone, methyl naphthyl ketone, cyclohexanone (CHN), methyl cyclohexanone, ionone, isophorone, propylene carbonate, γ-butyrolactone (GBL), diacetonyl alcohol, diacetone alcohol, acetyl carbinol, and the like. Among the above, as the ketone-based solvent, 2-heptanone (methyl amyl ketone) and cyclohexanone (CHN) are preferable.

<Ether-Based Solvent>

The ether-based solvent is an organic solvent having an ether bond (—O—) other than an ester bond. Examples of the ether-based solvent include alkylene glycol monoalkyl ethers such as propylene glycol monomethyl ether (PGME), ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, propylene glycol monoethyl ether, propylene glycol monopropyl ether, and propylene glycol monobutyl ether; polyhydric alcohol partial ethers such as ether-group containing alkylene glycol monoalkyl ether compounds such as diethylene glycol monomethyl ether, diethylene glycol monoethyl ether, diethylene glycol monopropyl ether, diethylene glycol monobutyl ether, diethylene glycol monohexyl ether, dipropylene glycol monomethyl ether, dipropylene glycol monoethyl ether, and dipropylene glycol monopropyl ether, and the like. Among the above, as the ether-based solvent, propylene glycol monomethyl ether (PGME) is preferable.

<Alcohol-Based Solvent>

The alcohol-based solvent is an organic solvent including an alcoholic hydroxyl group in the structure. "Alcoholic hydroxyl group" means a hydroxyl group bonded to a carbon atom of an aliphatic hydrocarbon group.

In the present specification, an alcohol-based solvent is not included in the ester-based solvent, the ketone-based solvent, and the ether-based solvent.

Examples of alcohol-based solvents include monoalcohols such as methanol, ethanol, n-propanol, isopropanol (IPA), n-butanol, sec-butanol, t-butanol, n-pentanol, 4-methyl-2-pentanol (methyl isobutyl carbinol), and 2-methylbutyl alcohol; polyhydric alcohols such as ethylene glycol, diethylene glycol, propylene glycol, and dipropylene glycol. Among the above, 4-methyl-2-pentanol (methyl isobutyl carbinol) is preferable.

<Nitrile-Based Solvent>

The nitrile-based solvent is an organic solvent including a nitrile group (—C≡N) in the structure.

Examples of the nitrile-based solvent include acetonitrile, propionitrile, valeronitrile, butyronitrile, and the like.

<Amide-Based Solvent>

The amide-based solvent is an organic solvent including an amide group in the structure.

Examples of the amide-based solvent include N,N-dimethylformamide, N-methylformamide, N,N-dimethylacetamide, N-methylacetamide, N,N-diethylacetamide, and the like.

<Sulfoxide-Based Solvent>

The sulfoxide-based solvent is an organic solvent including a sulfinyl group (—S(═O)—) in which two alkyl groups are bonded in the structure.

Examples of the sulfoxide-based solvent include dimethyl sulfoxide and the like.

Among the above, the (S) component preferably includes one type or more selected from the group consisting of ester-based solvents, ketone-based solvents, and alcohol-based solvents.

The (S) component included in the solution of the present embodiment may be one type or may be two types or more.

In a case of combining two types or more of organic solvents, it is preferable to use an ester-based solvent and an ether-based solvent. Using a mixed solvent of an ester-based solvent and an ether-based solvent makes it possible to further suppress the generation of defects.

As a combination of the mixed solvent of the ester-based solvent and the ether-based solvent, it is preferable to combine propylene glycol monomethyl ether acetate (PGMEA) with propylene glycol monomethyl ether (PGME), diethylene glycol monomethyl ether, diethylene glycol monoethyl ether, or diethylene glycol monobutyl ether.

Among the above, a combination (mixed solvent) of propylene glycol monomethyl ether acetate (PGMEA) and propylene glycol monomethyl ether (PGME) is preferable.

In a case where two types of organic solvents are used together, the mixing ratio (mass) is preferably in the range of 1/99 to 99/1, more preferably in the range of 10/90 to 90/10, and even more preferably in the range of 20/80 to 60/40.

In addition, three types or more of organic solvents may be mixed in any ratio. Mixing three types or more of organic solvents at an any ratio makes it possible to, for example, carry out operations such as delicate resist shape adjustment and viscosity adjustment. Examples of combinations of three types or more of organic solvents include a combination of PGMEA, PGME, and GBL, a combination of PGMEA, PGME, and CHN, a combination of PGMEA, PGME, and 2-heptanone, a combination of PGMEA, CHN, and GBL, a combination of PGMEA, GBL, and 2-heptanone, and the like.

The solution of the present embodiment is preferably a solution substantially formed of the organic solvent described above. Here, "substantially formed of the organic solvent" means that the content of the organic solvent is 98.00% by mass or more with respect to the total solution, preferably 99.00% by mass or more, more preferably 99.50% by mass or more, even more preferably 99.80% by mass or more, and particularly preferably 99.90% by mass or more. The upper limit is not particularly limited, but an example thereof is approximately 99.99% by mass.

Here, in a case of using 2 or more types of organic solvents together, the total content is preferably in the range described above.

<(A) Component: Antioxidant>

The solution of the present embodiment includes an (A) component: an antioxidant, and the (A) component includes an (A1) component: a tocopherol-based compound.

<(A1 Component: Tocopherol-Based Compound>

Tocopherol-Based Compound

The tocopherol-based compound is generally vitamin E and is a naturally occurring chemical substance.

Therefore, safety is high and the environmental impact is also small. In addition, since the tocopherol compound is oil-soluble and a liquid at normal temperature, the compatibility with resist compositions and the like and the precipitation resistance are excellent.

Examples of tocopherol-based compounds include tocopherol and derivatives thereof, and tocotrienol and derivatives thereof. It is known that tocopherol and tocotrienol have distinctions such as natural type compounds (d-form), non-natural type compounds (1-form), and racemic forms (dl-form) which are equivalent mixtures thereto. Natural type compounds (d-form) and racemic forms (dl-form) are used as food additives and the like, which is preferable.

Specific examples of tocopherols include d-α-tocopherol, dl-α-tocopherol, d-β-tocopherol, dl-β-tocopherol, d-γ-tocopherol, dl-γ-tocopherol, d-δ-tocopherol, and dl-δ-tocopherol.

Specific examples of tocotrienol include d-α-tocotrienol, dl-α-tocotrienol, d-β-tocotrienol, dl-β-tocotrienol, d-γ-tocotrienol, dl-γ-tocotrienol, d-δ-tocotrienol, and dl-δ-tocotrienol.

Specific examples of tocopherol derivatives include acetate esters, nicotinate esters, linoleate esters, succinate esters and the like of the tocophenol described above.

Specific examples of tocotrienol derivatives include acetate esters and the like of the tocotrienol described above.

The (A1) component included in the solution of the present embodiment may be one type or two types or more.

The content of the (A1) component is preferably 0.1 to 50 ppm by mass with respect to the total amount of the solution, more preferably 0.1 to 30 ppm by mass, and even more preferably 0.1 to 15 ppm by mass.

Setting the content of the (A1) component to be the lower limit value or more makes it possible to sufficiently obtain the effects caused by the (A1) component being contained, while being the upper limit value or less makes it possible to further suppress the generation of defects.

<A2 Component: Other Antioxidants>

The (A) component in the solution of the present embodiment may include an (A2) component: an antioxidant other than the (A1) component.

Examples of the (A2) component include phenolic-based antioxidants, hindered amine-based antioxidants, phosphorus-based antioxidants, sulfur-based antioxidants, benzotriazole-based antioxidants, benzophenone-based antioxidants, hydroxylamine-based antioxidants, salicylate ester-based antioxidants, triazine-based antioxidants, and the like.

Phenolic-Based Antioxidant

Examples of phenolic-based antioxidants include hindered phenolic-based antioxidants. Examples of hindered phenolic-based antioxidants include 2,4-bis[(laurylthio)methyl]-o-cresol, 1,3,5-tris(3,5-di-t-butyl-4-hydroxybenzyl), 1,3,5-tris(4-t-butyl-3-hydroxy-2,6-dimethylbenzyl), 2,4-bis-(n-octylthio)-6-(4-hydroxy-3,5)-di-t-butylanilino)-1,3,5-triazine, pentaerythritol tetrakis[3-(3,5-di-tert-butyl-4-hydroxyphenyl)propionate], 2,6-di-t-butyl-4-nonylphenol, 2,2'-isobutylidene-bis-(4,6-dimethyl-phenol), 4,4'-butylidene-bis-(2-t-butyl-5-methylphenol), 2,2'-thio-bis-(6-t-butyl-4-methylphenol), 2,5-di-t-amyl-hydroquinone, 2,2'-thiodiethylbis-(3,5-di-t-butyl-4-hydroxyphenyl)-propionate, 1,1,3-tris-(2'-methyl-4'-hydroxy-5'-t-butylphenyl)-butane, 2,2'-methylene-bis-(6-(1-methyl-cyclohexyl)-p-cresol), 2,4-dimethyl-6-(1-methyl-cyclohexyl)-phenol, N,N-hexamethylenebis(3,5-di-t-butyl-4-hydroxy-hydrocinnamamide), 4,4'-butylidenebis-(6-t-butyl-3-methylphenol), 2,2'-methylenebis-(4-ethyl-6-t-butylphenol), butylhydroxyanisole, and the like. It is also possible to use other oligomer type and polymer type compounds having a hindered phenol structure, and the like.

In addition, other than the hindered phenolic-based antioxidants described above, examples of the phenolic-based antioxidant include dibutyl hydroxy toluene (BHT) and hydroquinone.

Hindered Amine-Based Antioxidant

Examples of hindered amine-based antioxidants include bis(2,2,6,6-tetramethyl-4-piperidyl)sebacate, bis(N-methyl-2,2,6,6-tetramethyl-4-piperidyl)sebacate, N,N'-bis(2,2,6,6-tetramethyl-4-piperidyl)-1,6-hexamethylenediamine, 2-methyl-2-(2,2,6,6-tetramethyl-4-piperidyl)amino-N-(2,2,6,6-tetramethyl-4-piperidyl)propionamide, tetrakis(2,2,6,6-tetramethyl-4-piperidyl)(1,2,3,4-butanetetracarboxylate, poly[{6-(1,1,3,3-tetramethylbutyl)imino-1,3,5-triazine-2,4-diyl} {(2,2,6,6-tetramethyl-4-piperidyl)imino} hexamethyl {(2,2,6,6-tetramethyl-4-piperidyl)imino}], poly[(6-morpholino-1,3,5-triazine-2,4-diyl){(2,2,6,6-tetramethyl-4-piperidyl)imino}hexamethine {(2,2,6,6-tetramethyl-4-piperidyl)imino}], a polycondensate of dimethyl succinate and 1-(2-hydroxyethyl)-4-hydroxy-2,2,6,6-tetramethylpiperidine, and N,N'-4,7-tetrakis[4,6-bis{N-butyl-N-(1,2,2,6,6-pentamethyl-4-piperidyl)amino}-1,3,5-triazin-2-yl]-4,7-diazadecane-1,10-diamine, and the like. It is also possible to use other oligomer type and polymer type compounds having a hindered amine structure, and the like.

Phosphorus-Based Antioxidant

Phosphorous-based antioxidants include tris(isodecyl)phosphite, tris(tridecyl)phosphite, phenyl isooctyl phosphite, phenyl isodecyl phosphite, phenyl di(tridecyl)phosphite, diphenyl isooctyl phosphite, diphenyl isodecyl phosphite, diphenyltridecyl phosphite, triphenyl phosphite, tris(nonylphenyl)phosphite, 4,4'-isopropylidenediphenol alkyl phosphite, trisnonylphenyl phosphite, trisdinonylphenyl phosphite, tris(2,4-di-t-butylphenyl)phosphite, tris(biphenyl)phosphite, distearyl pentaerythritol diphosphite, di(2 4-di-t-butylphenyl)pentaerythritol diphosphite, di(nonylphenyl)pentaerythritol diphosphite, phenylbisphenol A pentaerythritol diphosphite, tetratridecyl 4,4'-butylidenebis (3-methyl-6-t-butylphenol) diphosphite, hexatridecyl 1,1,3-tris(2-methyl-4-hydroxy-5-t-butylphenyl)butane triphosphite, 3,5-di-t-butyl-4-hydroxybenzyl phosphite diethyl ester, sodium bis(4-t-butylphenyl)phosphite, sodium-2,2-methylene-bis(4,6-di-t-butylphenyl)-phosphite, 1,3-bis(diphenoxyphosphonoxy)-benzene, tris(2-ethylhexyl)phosphite, phosphorous acid triisodecyl, and phosphorous acid ethyl bis(2,4-di-tert-butyl-6-methylphenyl), and the like. In addition, it is also possible to use other oligomer type and polymer type compounds having a phosphite structure, and the like.

Sulfur-Based Antioxidant

Examples of sulfur-based antioxidants include 2,2-thiodiethylenebis[3-(3,5-di-t-butyl-4-hydroxyphenyl)propionate], 2,4-bis[(octylthio) methyl]-o-cresol, 2,4-bis[(laurylthio) methyl]-o-cresol, didodecyl 3,3'-thiodipropionate, dioctadecyl 3,3'-thiodipropionate, and ditetradecyl 3,3' thiodipropionate, and the like. It is also possible to use other oligomer type and polymer type compounds having a thioether structure, and the like.

Benzotriazole-Based Antioxidant

As the benzotriazole-based antioxidant, it is possible to use oligomer type and polymer type compounds having a benzotriazole structure, and the like.

Benzophenone-Based Antioxidant

Examples of benzophenone-based antioxidants include 2-hydroxy-4-methoxybenzophenone, 2,4-dihydroxybenzophenone, 2-hydroxy-4-n-octoxybenzophenone, 4-dodecyloxy-2-hydroxybenzophenone, 2-hydroxy-4-octadecyloxybenzophenone, 2,2'dihydroxy-4-methoxybenzophenone, 2,2'dihydroxy-4,4'-dimethoxybenzophenone, 2,2',4,4'-tetrahydroxybenzophenone, 2-hydroxy-4-methoxy-5-sulfobenzophenone, 2-hydroxy-4-methoxy-2'-carboxybenzophenone, 2-hydroxy-4-chlorobenzophenone, and the like. It is also possible to use other oligomer type and polymer type compounds having a benzophenone structure, and the like.

Hydroxylamine-Based Antioxidant

Examples of hydroxylamine-based antioxidants include hydroxylamine, hydroxylamine nitrate, hydroxylamine sulfate, hydroxylamine phosphate, hydroxylamine hydrochloride, hydroxylamine citrate, hydroxylamine oxalate, and the like.

Salicylate Ester-Based Antioxidant

Examples of salicylate ester-based antioxidants include phenyl salicylate, p-octylphenyl salicylate, p-tert butylphenyl salicylate, and the like. It is also possible to use other oligomer type and polymer type compounds having a salicylate ester structure, and the like.

Triazine-Based Antioxidant

Examples of triazine-based antioxidants include 2,4-bis (allyl)-6-(2-hydroxyphenyl)1,3,5-triazine, and the like. It is also possible to use other oligomer type and polymer type compounds or the like having a triazine structure, and the like.

The solution of the present embodiment is preferably used for at least one application selected from a cleaning solution for a semiconductor manufacturing apparatus, a pre-wetting solution, a developer solution, a rinsing solution, and a solvent included in a resist composition, in a semiconductor device manufacturing method.

Here, cleaning solutions for a semiconductor manufacturing apparatus include, for example, a cleaning solution used for cleaning supply piping of a semiconductor manufacturing apparatus.

The solution of the present embodiment described above is a solution containing an (S) component: an organic solvent and an (A) component: antioxidant, in which the (A) component includes an (A1) component: tocopherol-based compound. Containing the (A1) component makes it possible to prevent the oxidative deterioration of the (S) component and to improve the stability of the solution. In addition, since the (A1) component is oil-soluble and a liquid at normal temperature, the compatibility with a resist composition and the like and the precipitation resistance are excellent. Therefore, it is presumed that the solution of the present embodiment has high stability and is able to suppress the generation of defects.

In addition, since the (A1) component is also a naturally derived chemical substance, safety is high and the environmental impact is small.

(Method of Forming a Resist Pattern)

The method of forming a resist pattern of the present embodiment has (i) a step of forming a resist film on a support using a resist composition;

(ii) a step of exposing the resist film; and (iii) a step of developing the resist film after exposure using a developer solution to form a resist pattern, in which the solution according to the first aspect of the present invention is used in any one or more of the resist composition in the step (i) and the developer solution in the step (iii).

<(I): Step of Forming Resist Film>

The step of forming a resist film is a step of forming a resist film on a support using a resist composition.

Examples of the resist composition include a chemically amplified resist composition containing a base material component, for which the solubility in a developer solution is changed by the action of an acid, and an acid generator component, which generates an acid when exposed, and the like.

Examples of the base resin used in the chemically amplified resist composition include, in a case of a resin component for which the solubility in an alkaline developer solution is increased by the action of an acid, a base resin having a structural unit including an acid-decomposable group for which polarity is increased by being decomposed by the action of an acid generated from an acid generator or the like, a structural unit including a lactone-containing cyclic group, a structural unit including a polar group such as a hydroxyl group, or the like.

Examples of the acid generator used in the chemically amplified resist composition include onium salt-based acid generators such as iodonium salts and sulfonium salts, oxime sulfonate-based acid generators, diazomethane-based acid generators, nitrobenzyl sulfonate-based acid generators, iminosulfonate acid-based generators, disulfone-based acid generators, and the like.

Examples of onium salt-based acid generators mainly include acid generators having onium ions such as triphenylsulfonium in the cationic portion. Examples of the anionic portion of the onium salt-based acid generator include alkyl sulfonate ions and fluorinated alkyl sulfonate ions in which part or all of the hydrogen atoms of the alkyl group are substituted with fluorine atoms, or the like.

In addition, examples of other components include at least one type of compound selected from the group consisting of a quencher (acid diffusion controller) which traps acid generated by exposure in a resist composition, an organic carboxylic acid, an oxo acid of phosphorus, derivatives thereof, fluorine additives, organic solvents and the like.

Examples of a step of forming a resist film include coating the resist composition described above (chemically amplified resist composition or the like) on a support with a spinner or the like, and forming a resist film by carrying out a baking (post-apply bake (PAB)) treatment, for example, for 40 to 120 seconds, and preferably 60 to 90 seconds, at a temperature of 80 to 150° C.

<(ii): Step of Exposing Resist Film>

Examples of a step of exposing the resist film include a method in which, after performing selective exposure by drawing or the like by exposure via a mask (mask pattern) on which a predetermined pattern is formed or by direct irradiation of an electron beam without using a mask pattern, using an exposure apparatus such as an electron beam drawing apparatus or an EUV exposure apparatus, a baking (post-exposure baking (PEB)) treatment is carried out, for example, for 40 to 120 seconds, and preferably 60 to 90 seconds at a temperature of 80 to 150° C.

The wavelength used for the exposure is not particularly limited, and it is possible to perform the exposure using radiation such as an ArF excimer laser, a KrF excimer laser, an $F_2$ excimer laser, EUV (extreme ultraviolet rays), VUV (vacuum ultraviolet rays), EB (electron beams), X-rays, soft X-rays, and the like.

<(iii): Step of Developing Using Developer solution to Form a Resist Pattern>

Examples of the step of forming a resist pattern by developing using a developer solution include a method of forming a resist pattern in which an alkali developer solution is used in the case of an alkali developing process, and a developer solution containing an organic solvent (organic developer solution) is used in the case of a solvent developing process.

Examples of the alkali developer solution used for the developing process in the alkali developing process include an aqueous solution of 0.1 to 10% by mass of tetramethylammonium hydroxide (TMAH).

Examples of the organic solvent contained in the organic developer solution used for the developing process in the solvent developing process include the same examples as the (S) component described above.

A rinsing process may be performed after the developing process described above. The rinsing process is preferably a water rinse using pure water in the case of an alkali developing process and it is preferable to use a rinsing solution containing an organic solvent in the case of a solvent developing process.

In the case of the solvent developing process, a process of removing the developer solution or rinsing solution attached to the pattern using a supercritical fluid may be performed after the developing process or the rinsing process.

After the developing process or the rinsing process, drying is performed. In addition, depending on the case, a baking process (post-bake) may be performed after the developing process described above.

The support is not particularly limited, and it is possible to use a support known in the related art and examples thereof include a substrate for electronic components, a support with a predetermined wiring pattern formed thereon, and the like. More specific examples thereof include a silicon wafer, a metal substrate such as copper, chromium, iron, and aluminum, a glass substrate, and the like. As a material for the wiring pattern, for example, it is possible to use copper, aluminum, nickel, gold, or the like.

In addition, the support may be a support in which an inorganic and/or organic film is provided on a substrate as described above. Examples of an inorganic film include an inorganic antireflection film (inorganic BARC). Examples of the organic film include an organic antireflection film (organic BARC) and an organic film such as a lower layer organic film in a multilayer resist method.

Here, the multilayer resist method is a method in which at least one layer of an organic film (lower layer organic film) and at least one layer of a resist film (upper layer resist film) are provided on a substrate, and patterning of the lower layer organic film is performed with the resist pattern formed on the upper resist film as a mask and it is possible to form a pattern with a high aspect ratio. That is, according to the multilayer resist method, since it is possible to secure the desired thickness using the lower layer organic film, it is possible to thin the resist film and to form a fine pattern with a high aspect ratio.

Multilayer resist methods are basically divided into a method (two layer resist method) having a two-layer structure of an upper layer resist film and a lower layer organic film, and a method (three-layer resist method) having a multilayer structure of three or more layers in which one or more intermediate layers (metal thin film or the like) is provided between the upper layer resist film and the lower layer organic film.

The method of forming a resist pattern of the present embodiment may further have (iv) a step of bringing a pre-wetting solution into contact with the support before (i) the step of forming a resist film using the resist composition on the support, in which the solution according to the first aspect of the present invention may be used as the pre-wetting solution in the step (iv).

<(iv): Pre-Wetting Step>

The pre-wetting step is a step of bringing a pre-wetting solution into contact with a support.

The method of bringing the pre-wetting solution into contact with the support is not particularly limited and, for example, it is possible to apply a method of continuously discharging a pre-wetting solution onto a support rotating at a constant speed (rotary coating method), a method of immersing a support in a tank filled with a pre-wetting solution for a certain time (dip method), a method of spraying a pre-wetting solution on a surface of a support (spray method), and the like.

In the method of forming a resist pattern of the present embodiment described above, since the solution according to the first aspect described above is used, it is possible to suppress the generation of defects when forming a resist pattern. In addition, the safety and environmental impact reduction are excellent.

(Semiconductor Device Manufacturing Method)

A fifth aspect of the present invention is a method for manufacturing a semiconductor device, including a step of forming a resist pattern by the method of forming a resist pattern according to any one of the second to fourth aspects of the present invention.

As a semiconductor device manufacturing method, for example, a resist pattern formed by the method of forming a resist pattern according to any one of the second to fourth aspects of the present invention is set as a mask, etching is performed by a known etching method, a fine circuit is formed, then, an unnecessary resist film is removed with a treatment solution for peeling to carry out the manufacturing.

EXAMPLES

A more detailed description will be given below of the present invention with reference to Examples, but the present invention is not limited to these Examples.

<Preparation of Solution>

Examples 1-9, Comparative Examples 1-14

Each component shown in Tables 1 to 3 was mixed to prepare the solutions of each example. Here, the content of the (S) component is the amount (% by mass) excluding the content of the (A) component from the whole solution. In addition, Comparative Examples 2, 4, 6, 8, 10, 12, and 14 are only the (S) component.

TABLE 1

| | (A) Component | | |
|---|---|---|---|
| | (A1) Component | (A2) Component | (S) Component |
| Example 1 | (A1)-1 [5 ppm] | — | (S)-1 |
| Example 2 | (A1)-1 [50 ppm] | — | (S)-1 |
| Example 3 | (A1)-1 [100 ppm] | — | (S)-1 |
| Comparative Example 1 | — | (A2)-1 [5 ppm] | (S)-1 |
| Comparative Example 2 | — | — | (S)-1 |

TABLE 2

| | (A) Component | | |
|---|---|---|---|
| | (A1) Component | (A2) Component | (S) Component |
| Example 4 | (A1)-1 [5 ppm] | — | (S)-2 |
| Example 5 | (A1)-1 [5 ppm] | — | (S)-3 |
| Example 6 | (A1)-1 [5 ppm] | — | (S)-4 |
| Comparative Example 3 | — | (A2)-1 [5 ppm] | (S)-2 |
| Comparative Example 4 | — | — | (S)-2 |
| Comparative Example 5 | — | (A2)-1 [5 ppm] | (S)-3 |
| Comparative Example 6 | — | — | (S)-3 |
| Comparative Example 7 | — | (A2)-1 [5 ppm] | (S)-4 |
| Comparative Example 8 | — | — | (S)-4 |

TABLE 3

| | (A) Component | | |
|---|---|---|---|
| | (A1) Component | (A2) Component | (S) Component |
| Example 7 | (A1)-1 [5 ppm] | — | (S)-5 |
| Example 8 | (A1)-1 [5 ppm] | — | (S)-6 |
| Example 9 | (A1)-1 [5 ppm] | — | (S)-7 |
| Comparative Example 9 | — | (A2)-1 [5 ppm] | (S)-5 |
| Comparative Example 10 | — | — | (S)-5 |
| Comparative Example 11 | — | (A2)-1 [5 ppm] | (S)-6 |
| Comparative Example 12 | — | — | (S)-6 |
| Comparative Example 13 | — | (A2)-1 [5 ppm] | (S)-7 |
| Comparative Example 14 | — | — | (S)-7 |

In Tables 1 to 3, each reference numeral has the following meaning. The value in [ ] is the content (% by mass).

(A1)-1: α-Tocopherol (A2)-1: Dibutyl hydroxy toluene (BHT)

(S)-1: Propylene glycol monomethyl ether (PGME)

(S)-2: 2-heptanone (methyl amyl ketone)

(S)-3: ethyl lactate (EL)

(S)-4: cyclohexanone (CHN)

(S)-5: 4-methyl-2-pentanol (methyl isobutyl carbinol)

(S)-6: γ-butyrolactone (GBL)

(S)-7: propylene glycol monomethyl ether acetate (PGMEA)

[Defect Evaluation]

3 mL of each solution of Example 1, Comparative Example 1, and Comparative Example 2 was discharged onto a silicon wafer. Thereafter, the silicon wafer was spin-dried and then heat-dried (80° C.). For the silicon wafer obtained after drying, the number of defects having a diameter of 17 nm or more present on the surface of the silicon wafer having a diameter of 300 mm was measured, using a surface inspection apparatus (product name: SP-5, manufactured by KLA Tencor).

For the defect evaluation, the evaluation results are shown in Table 4 as "Defects" according to the evaluation criteria described below.

Evaluation Criteria

○: The number of defects is 80 or less

Δ: The number of defects is more than 80

TABLE 4

| | Defects |
|---|---|
| Example 1 | ○ |
| Comparative Example 1 | Δ |
| Comparative Example 2 | ○ |

From the results shown in Table 4, it is possible to confirm that the solution of Example 1 is excellent in defect suppression.

[Evaluation of Peroxide Content]

Each solution of the Examples and Comparative Examples was stored at 40° C. for 3 months. Then, for the solutions, the content (content with respect to the whole solution) of the peroxide in the solution was measured immediately after preparation, one month after, two months after, and three months after. Measurement was carried out using GC-MS (product name "GCMS-2020", manufactured by Shimadzu Corporation) and measurement results determined by the area percentage method are shown in Tables 5 to 7.

TABLE 5

| | Content of peroxide (mmol/g) | | | |
|---|---|---|---|---|
| | Immediately after preparation | One month after | Two months after | Three months after |
| Example 1 | 0 | 0.1 | 0.1 | 0.1 |
| Example 2 | 0 | 0.1 | 0.1 | 0.1 |
| Example 3 | 0 | 0.1 | 0.1 | 0.1 |
| Comparative Example 1 | 0 | 0.1 | 0.1 | 0.2 |
| Comparative Example 2 | 0 | 0.3 | 1.7 | 16.5 |

TABLE 6

| | Content of peroxide (mmol/g) | | | |
|---|---|---|---|---|
| | Immediately after preparation | One month after | Two months after | Three months after |
| Example 4 | 0.5 | 0.6 | 0.6 | 0.6 |
| Example 5 | 0.2 | 0.2 | 0.2 | 0.2 |
| Example 6 | 0.5 | 0.6 | 0.6 | 0.6 |
| Comparative Example 3 | 0.5 | 0.6 | 0.7 | 0.9 |
| Comparative Example 4 | 0.5 | 2.8 | 4.5 | 7.4 |
| Comparative Example 5 | 0.2 | 0.2 | 0.2 | 0.3 |
| Comparative Example 6 | 0.2 | 2.8 | 18.1 | 43.3 |
| Comparative Example 7 | 0.5 | 0.9 | 0.9 | 0.9 |
| Comparative Example 8 | 0.7 | 1.3 | 2.7 | 5.8 |

TABLE 7

| | Content of peroxide (mmol/g) | | | |
|---|---|---|---|---|
| | Immediately after preparation | One month after | Two months after | Three months after |
| Example 7 | 0.1 | 0.2 | 0.1 | 0.1 |
| Example 8 | 0 | 0 | 0 | 0 |
| Example 9 | 0.1 | 0.1 | 0.1 | 0.1 |
| Comparative Example 9 | 0.3 | 0.3 | 0.3 | 0.3 |
| Comparative Example 10 | 0.1 | 0.2 | 0.4 | 0.7 |
| Comparative Example 11 | 0 | 0 | 0 | 0 |
| Comparative Example 12 | 0 | 0.1 | 0.2 | 0.3 |
| Comparative Example 13 | 0.1 | 0.2 | 0.1 | 0.1 |
| Comparative Example 14 | 0.1 | 0.3 | 0.7 | 1.8 |

From the results shown in Tables 5 to 7, it is possible to confirm that, in the solutions of the Examples to which the present invention was applied, the peroxide was not increased and oxidative deterioration was prevented in all of the organic solvents. Therefore, it is possible to confirm that the solutions of the Examples to which the present invention was applied had high stability.

From the above results, it is possible to confirm that the solution of the present embodiment has high stability and is able to suppress the generation of defects.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A solution consisting of an organic solvent (S), and an antioxidant (A), wherein the antioxidant (A) includes a tocopherol compound (A1), the organic solvent (S) consists of at least one member selected from the group consisting of methyl acetate, ethyl acetate, propyl acetate, isopropyl acetate, butyl acetate, amyl acetate, isoamyl acetate, ethyl methoxyacetate, ethyl ethoxyacetate, 2-methoxybutyl acetate, 3-methoxybutyl acetate, 4-methoxybutyl acetate, 3-methoxy-3-methylbutyl acetate, 3-ethyl acetate-3-methoxybutyl, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monoethyl ether acetate, diethylene glycol monopropyl ether acetate, diethylene glycol monobutyl ether acetate, diethylene glycol monophenyl ether acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, propyl formate, butyl formate, ethyl lactate, propyl lactate, butyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, propyl-3-methoxypropionate, acetone, 1-hexanone, 2-hexanone, 4-heptanone, 2-heptanone, 1-octanone, 2-octanone, 1-nonanone, 2-nonanone, diisobutyl ketone, methyl ethyl ketone, methyl isobutyl ketone, acetyl acetone, acetonyl acetone, phenyl acetone, acetophenone, methyl naphthyl ketone, cyclohexanone, methyl cyclohexanone, ionone, isophorone, propylene carbonate, γ-butyrolactone, diacetonyl alcohol, diacetone alcohol, acetyl carbinol, propylene glycol monomethyl ether, ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, propylene glycol monoethyl ether, propylene glycol monopropyl ether, propylene glycol monobutyl ether, diethylene glycol monomethyl ether, diethylene glycol monoethyl ether, diethylene glycol monopropyl ether, diethylene glycol monobutyl ether, diethylene glycol monohexyl ether, dipropylene glycol monomethyl ether, dipropylene glycol monoethyl ether, dipropylene glycol monopropyl ether, methanol, ethanol, n-propanol, isopropanol, n-butanol, sec-butanol, t-butanol, n-pentanol, 4-methyl-2-pentanol, 2-methylbutyl alcohol, ethylene glycol, diethylene glycol, propylene glycol, dipropylene glycol, acetonitrile, propionitrile, valeronitrile, butyronitrile, N,N-dimethylformamide, N-methylformamide, N,N-dimethylacetamide, N-methylacetamide, N,N-diethylacetamide, dimethyl sulfoxide, the content of the organic solvent (S) is 98.00% by mass or more with respect to the total amount of the solution, the solution is a pre-wet solution, and the content of the tocopherol compound (A1) is 0.1 to 50 ppm by mass with respect to a total amount of the pre-wet solution.

2. A solution consisting of:

an organic solvent (S); and an antioxidant (A), wherein the antioxidant (a) includes a tocopherol compound (A1), the organic solvent (S) consists of at least one member selected from the group consisting of methyl acetate, ethyl acetate, propyl acetate, isopropyl acetate, butyl acetate, amyl acetate, isoamyl acetate, ethyl methoxyacetate, ethyl ethoxyacetate, 2-methoxybutyl acetate, 3-methoxybutyl acetate, 4-methoxybutyl acetate, 3-methoxy-3-methylbutyl acetate, 3-ethyl acetate-3-methoxybutyl, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monoethyl ether acetate, diethylene glycol monopropyl ether acetate, diethylene glycol monobutyl ether acetate, diethylene glycol monophenyl ether acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, propyl formate, butyl formate, ethyl lactate, propyl lactate, butyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, propyl-3-methoxypropionate, acetone, 1-hexanone, 2-hexanone, 4-heptanone, 2-heptanone, 1-octanone, 2-octanone, 1-nonanone, 2-nonanone, diisobutyl ketone, methyl ethyl ketone, methyl isobutyl ketone, acetyl acetone, acetonyl acetone, phenyl acetone, acetophenone, methyl naphthyl ketone, cyclohexanone, methyl cyclohexanone, ionone, isophorone, propylene carbonate, γ-butyrolactone, diacetonyl alcohol, diacetone alcohol, acetyl carbinol, propylene glycol monomethyl ether, ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, propylene glycol monoethyl ether, propylene glycol monopropyl ether, propylene glycol monobutyl ether, diethylene glycol monomethyl ether, diethylene glycol monoethyl ether, diethylene glycol monopropyl ether, diethylene glycol monobutyl ether, diethylene glycol monohexyl ether, dipropylene glycol monomethyl ether, dipropylene glycol monoethyl ether, dipropylene glycol monopropyl ether, methanol, ethanol, n-propanol, isopropanol, n-butanol, sec-butanol, t-butanol, n-pentanol, 4-methyl-2-pentanol, 2-methylbutyl alcohol, ethylene glycol, diethylene glycol, propylene glycol, dipropylene glycol, acetonitrile, propionitrile, valeronitrile, butyronitrile, N,N-dimethylformamide, N-methylformamide, N,N-dimethylacetamide, N-methylacetamide, N,N-diethylacetamide, dimethyl sulfoxide, the content of the organic solvent (S) is 98.00% by mass or more with respect to the total amount of the solution, the solution is a resist developer solution, and a content of the tocopherol compound (A1) is 0.1 to 50 ppm by mass with respect to a total amount of the resist developer solution.

3. A solution consisting of:

an organic solvent (S), and an antioxidant (A), wherein the antioxidant (A) includes a tocopherol compound (A1), the organic solvent (S) consists of at least one member selected from the group consisting of methyl acetate, ethyl acetate, propyl acetate, isopropyl acetate, butyl acetate, amyl acetate, isoamyl acetate, ethyl methoxyacetate, ethyl ethoxyacetate, 2-methoxybutyl acetate, 3-methoxybutyl acetate, 4-methoxybutyl acetate, 3-methoxy-3-methylbutyl acetate, 3-ethyl acetate-3-methoxybutyl, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monoethyl ether acetate, diethylene glycol monopropyl ether acetate, diethylene glycol monobutyl ether acetate, diethylene glycol monophenyl ether acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, propyl formate, butyl formate, ethyl lactate, propyl lactate, butyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, propyl-3-methoxypropionate, acetone, 1-hexanone, 2-hexanone, 4-heptanone, 2-heptanone, 1-octanone, 2-octanone, 1-nonanone, 2-nonanone, diisobutyl ketone, methyl ethyl ketone, methyl isobutyl ketone, acetyl acetone, acetonyl acetone, phenyl acetone, acetophenone, methyl naphthyl ketone, cyclohexanone, methyl cyclohexanone, ionone, isophorone, propylene carbonate, γ-butyrolactone, diacetonyl alcohol, diacetone alcohol, acetyl carbinol, propylene glycol monomethyl ether, ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, propylene glycol monoethyl ether, propylene glycol monopropyl ether, propylene glycol monobutyl ether, diethylene glycol monomethyl ether, diethylene glycol monoethyl ether, diethylene glycol monopropyl ether, diethylene glycol monobutyl ether, diethylene glycol monohexyl ether, dipropylene glycol monomethyl ether, dipropylene glycol monoethyl ether, dipropylene glycol monopropyl ether, methanol, ethanol, n-propanol, isopropanol, n-butanol, sec-butanol, t-butanol, n-pentanol, 4-methyl-2-pentanol, 2-methylbutyl alcohol, ethylene glycol, diethylene glycol, propylene glycol, dipropylene glycol, acetonitrile, propionitrile, valeronitrile, butyronitrile, N,N-dimethylformamide, N-methylformamide, N,N-dimethylacetamide, N-methylacetamide, N,N-diethylacetamide, dimethyl sulfoxide, the content of the organic solvent (S) is 98.00% by mass or more with respect to the total amount of the solution, the solution is a rinsing solution, and a content of the tocopherol compound (A1) is 0.1 to 50 ppm by mass with respect to a total amount of the rinsing solution.

4. A solution consisting of:

an organic solvent (S), and an antioxidant (A), wherein the antioxidant (A) includes a tocopherol compound (A1), the organic solvent (S) consists of at least one member selected from the group consisting of methyl acetate, ethyl acetate, propyl acetate, isopropyl acetate, butyl acetate, amyl acetate, isoamyl acetate, ethyl methoxyacetate, ethyl ethoxyacetate, 2-methoxybutyl acetate, 3-methoxybutyl acetate, 4-methoxybutyl acetate, 3-methoxy-3-methylbutyl acetate, 3-ethyl acetate-3-methoxybutyl, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monoethyl ether acetate, diethylene glycol monopropyl ether acetate, diethylene glycol monobutyl ether acetate, diethylene glycol monophenyl ether acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, propyl formate, butyl formate, ethyl lactate, propyl lactate, butyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, propyl-3-methoxypropionate, acetone, 1-hexanone, 2-hexanone, 4-heptanone, 2-heptanone, 1-octanone, 2-octanone, 1-nonanone, 2-nonanone, diisobutyl ketone, methyl ethyl ketone, methyl isobutyl ketone, acetyl acetone, acetonyl acetone, phenyl acetone, acetophenone, methyl naphthyl ketone, cyclohexanone, methyl cyclohexanone, ionone, isophorone, propylene carbonate, γ-butyrolactone, diacetonyl alcohol, diacetone alcohol, acetyl carbinol, propylene glycol monomethyl ether, ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, propylene glycol monoethyl ether, propylene glycol monopropyl ether, propylene glycol monobutyl ether, diethylene glycol monomethyl ether, diethylene glycol monoethyl ether, diethylene glycol monopropyl ether, diethylene glycol monobutyl ether, diethylene glycol monohexyl ether, dipropylene glycol monomethyl ether, dipropylene glycol monoethyl ether, dipropylene glycol monopropyl ether, methanol, ethanol, n-propanol, isopropanol, n-butanol, sec-butanol, t-butanol, n-pentanol, 4-methyl-2-pentanol, 2-methylbutyl alcohol, ethylene glycol, diethylene glycol, propylene glycol, dipropylene glycol, acetonitrile, propionitrile, valeronitrile, butyronitrile, N,N-dimethylformamide, N-methylformamide, N,N-dimethylacetamide, N-methylacetamide, N,N-diethylacetamide, dimethyl sulfoxide, the content of the organic solvent (S) is 98.00% by mass or more with respect to the total amount of the solution, the solution is a semiconductor device cleaning solution, and a content of the tocopherol compound (A1) is 0.1 to 50 ppm by mass with respect to a total amount of the semiconductor device cleaning solution.

5. A method of forming a resist pattern comprising:

bringing the solution of claim 1 into contact with a support;

forming a resist film on the support using a resist composition after bringing the solution of claim 1 into contact with the support;

exposing the resist film; and developing the resist film after exposure using a developer solution to form a resist pattern.

6. A method of forming a resist pattern comprising:

forming a resist film on a support using a resist composition;

exposing the resist film; and developing the resist film after exposure using the solution of claim 1 to form a resist pattern.

7. A method of forming a resist pattern comprising:

forming a resist film on a support using a resist composition;

exposing the resist film; and developing the resist film after exposure using a developer solution and carrying out a rinsing process with the solution of claim 1 to form a resist pattern.

8. A method for manufacturing a semiconductor device, comprising forming a resist pattern using the method according to claim 5.

9. A method for manufacturing a semiconductor device, comprising forming a resist pattern using the method according to claim 6.

10. A method for manufacturing a semiconductor device, comprising forming a resist pattern using the method according to claim 7.

* * * * *